United States Patent [19]

Jackson

[11] Patent Number: 4,587,540
[45] Date of Patent: May 6, 1986

[54] VERTICAL MESFET WITH MESA STEP DEFINING GATE LENGTH

[75] Inventor: Thomas N. Jackson, Ossining, N.Y.

[73] Assignee: International Business Machines Corporation, Armonk, N.Y.

[21] Appl. No.: 705,287

[22] Filed: Jan. 17, 1985

Related U.S. Application Data

[63] Continuation of Ser. No. 365,806, Apr. 5, 1982, abandoned.

[51] Int. Cl.⁴ .................. H01L 29/80; H01L 29/08; H01L 29/40
[52] U.S. Cl. ........................ 357/22; 357/15; 357/56
[58] Field of Search ............... 357/15, 22, 56

[56] References Cited

U.S. PATENT DOCUMENTS

| | | | |
|---|---|---|---|
| 2,814,853 | 12/1957 | Paskell | 357/56 |
| 3,535,170 | 10/1970 | Hughes | 357/56 |
| 3,855,608 | 12/1974 | George et al. | 357/22 |
| 3,938,241 | 2/1976 | George et al. | 29/571 |
| 3,999,281 | 12/1976 | Goronkin et al. | 357/22 |
| 4,099,987 | 7/1978 | Jambotkar | 357/56 |
| 4,129,879 | 12/1978 | Tantraporn et al. | 357/22 |
| 4,236,166 | 11/1980 | Cho et al. | 357/22 |
| 4,262,296 | 4/1981 | Shealy et al. | 357/55 |
| 4,377,899 | 3/1983 | Otani et al. | 357/56 |

FOREIGN PATENT DOCUMENTS

| | | |
|---|---|---|
| 0051504 | 5/1982 | European Pat. Off. . |
| 1361920 | 4/1964 | France ............ 357/22 |
| 2064868 | 6/1981 | United Kingdom . |
| 2083947 | 3/1982 | United Kingdom . |

OTHER PUBLICATIONS

Alley et al., "Recent Experimental Results on Permeable Base Transistor" IEDM Technical Digest 24.1, pp. 608-612, Dec. 1980.

Dekkers et al., "Buried Channel GaAs MESFET's Scattering Parameter and Linearity Dependence on the Channel Doping Profile," IEEE Trans. on Electron Devices, vol.-ED28, No. 9, Sep. 1981, pp. 1065-1070.

Primary Examiner—Andrew J. James
Assistant Examiner—John Lamont
Attorney, Agent, or Firm—Alvin J. Riddles

[57] ABSTRACT

The edge of a conformal coating over a mesa is usable to define a shoulder in the vertical dimension of the mesa which in turn is used for positioning. Structures are provided that permit electrodes at precise locations along the length of a mesa. A vertical field effect transistor is set forth with a mesa serving as the channel and the gate electrode positioned at a shoulder formed by the edge dimension of a coating on the sides of the mesa.

2 Claims, 9 Drawing Figures

VERTICAL MESFET WITH MESA STEP DEFINING GATE LENGTH

DESCRIPTION

1. Technical Field

The technical field of the invention is that of achieving very small dimensions in semiconductor devices. In general in this field, the smaller the device dimensions the greater the speed with which the device can operate. As extremely high-speed semiconductor devices are sought, the particularly small dimensions required are generally beyond the resolution of the standard photolithographic techniques currently used in the art.

One particular device structure is the field effect transistor wherein the source, the drain and the gate contacts are in line on the surface of the substrate and the dimension between the source and drain electrodes thereof is being reduced to the range of around a half micron which is beyond the readily reproducible range of processing.

2. Background Art

There have been approaches in the art to achieve the needed small dimensions indirectly. One approach that has been applied to the field effect type of transistor is through the use of the edge of a metal layer as the gate electrode. A typical such device is shown in the 1980 IEDM Technical Digest, Volume 24, No. 1, page 608, known as the permeable base transistor. This structure, however, as may be seen from the description requires great care to fabricate and the resulting structure has a high gate capacitance which introduces circuit limitations.

DISCLOSURE OF THE INVENTION

Figure 1:
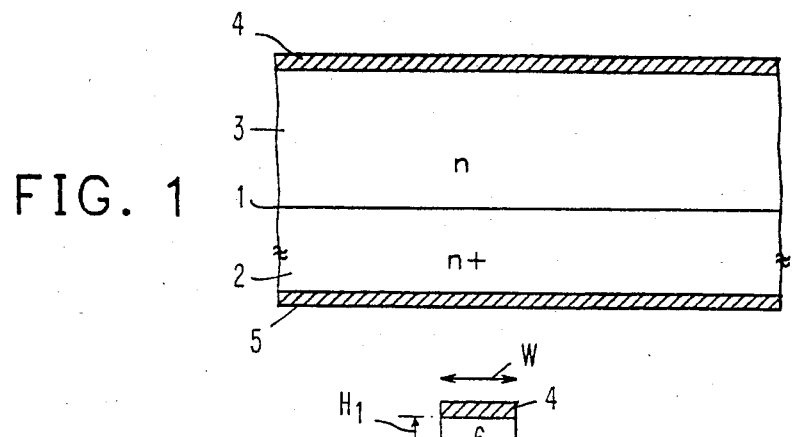
FIGS. 1 to 9 are illustrations of partially completed structures in the practice of the invention.

The invention is the use of the edge dimension of a deposited material in further processing steps to produce a precise very small dimension in a structure. The invention uses the edge dimension to provide a shoulder on a mesa for further steps that define both vertical and horizontal positions with respect to the surface of a substrate.

In practicing the invention, the coating on the side of a mesa has a very small edge dimension. A vertical erosion step using the coating including the edge dimension as a mask will produce a horizontal shoulder on the mesa which in turn is usable for vertical positioning.

Let it be assumed for reference perspective that the surface of a substrate is the horizontal direction and the direction perpendicular to the surface of the substrate is the vertical direction. The invention is practiced by first forming a mesa on a substrate. The mesa is to serve as at least a portion of a device to be fabricated. The horizontal dimensions are established using the edge of a precisely deposited resist and a vertical erosion or etching operation. Since the erosion is vertical to the surface, accuracy is enhanced on this dimension. Accuracy in the vertical direction is controlled by the etching or erosion which are very precise operations. A conformal coating is next placed over the surface of the substrate and over both the top and sides of the mesa. The coating is such that the portion on the horizontal surfaces is removable without significant removal of the portion on the sides of the mesa. The edge of the coating on the sides of the mesa is next used to control the horizontal extent of a vertical processing step that changes the characteristics of the substrate around the mesa so that the mesa now has a shoulder on the mesa at the surface. An erosion step is next performed that removes the substrate surrounding the shoulder so that the mesa is elongated with the shoulder as a reference location at an intermediate position in the length. The coating on the sides of the mesa may now be removed and the shoulder and the relation thereof to the surface of the substrate and the ends of the mesa may be used for locating purposes in further processing.

The invention is illustrated in connection with the production of a vertical field effect transistor wherein the separation distance from the source to drain electrodes is achieved vertically by a mesa channel region having a shoulder to which is abutted a gate electrode. The field effect transistor structure is made by forming a mesa on a substrate with a height of the order of the channel length, placing thereover a conformal coating, removing the conformal coating except for the sides of the mesa, converting the area around the mesa to device isolating type material thereby establishing a shoulder on the mesa at the substrate surface, removing the insulating material around the mesa to a depth to expose a portion of the sides, applying a gate metal coating over the semi-insulating material and the exposed sides of the mesa, separating the coating in the gate and drain contacts by the "lift-off" technique by dissolving the remains of the conformal coating. The technique of the invention results in an epitaxial vertical web with a shoulder between the extremities thereof.

BEST MODE FOR CARRYING OUT THE INVENTION

The technique of the invention is illustrated as applied to a field effect transistor provides a vertical channel region through the use of the edge of a conformal coating applied to the sides of a mesa and the use of further eroding processing to produce a shoulder which serves for positioning of the gate contacts.

Referring to FIG. 1, a substrate 1 which may be a single or an area of devices is shown having a high conductivity lower region 2 and a device region 3 of moderate conductivity, each region having an alloyed metal ohmic contact 4 and 5.

Figure 2:
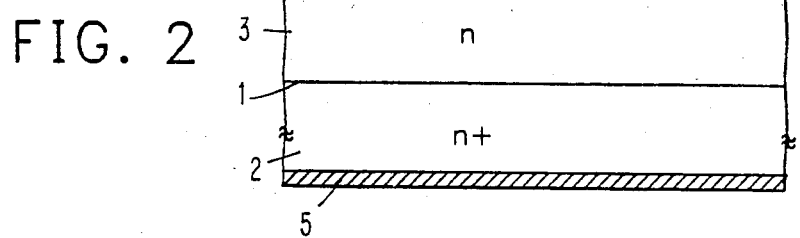

For purposes of simplicity of explanation for the field effect device preferred embodiment, the semiconductor material will be arbitrarily chosen as GaAs and the conductivity type will be chosen as n, although it will be apparent to one skilled in the art in the light of the principles set forth that other semiconductors and the other conductivity type may be employed Referring next to FIG. 2, the horizontal dimensions, one of which is labelled W, of a mesa 6 are produced by fine line lithography. Since the FET device will need an ohmic drain contact to the mesa that is to be fabricated, the substrate had the metal layer 4 applied first. The fine line lithography is followed by an ion milling operation to a depth dimension $H_1$ which operates to form the structure shown in FIG. 2. The distance between the contact 5 which will serve as the source and the contact 4 which will serve as the drain of the FET device being formed will be the length of the mesa 6. The dimension W, the width of the channel, should be of the order of 0.1–0.5 microns, with the $H_1$ dimension being provided by the ion milling operation to a depth of about 0.35 microns.

Figure 3:
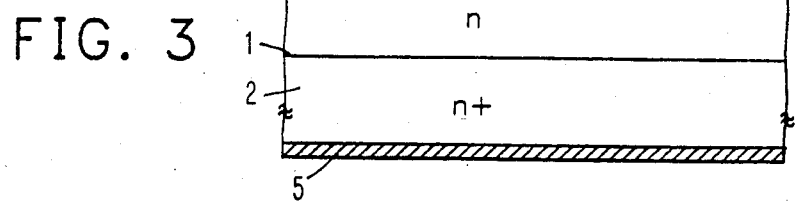

In FIG. 3, a conformal coating 7 is deposited over the surface of the substrate and over the top and sides of the mesa 6. The coating may be applied by the usual even coating type processes standard in the art such as chemical vapor deposition, vacuum deposition and sputtering. The material employed for the coating is such that it may be removed from the horizontal areas without significant removal from the sides of the mesa. Some materials have a degree of anisotropy in etching such that the etching proceeds faster in the vertical direction and hence would remove the material on the horizontal surfaces more rapidly. The materials $SiO_2$ and $Si_3N_4$ can exhibit etching anisotropy in plasma or reactive ion etching. The thickness of the coating 7 on the sides of the mesa 6 will determine the dimension of the shoulder. A coating of 0.02–0.1 microns in thickness is satisfactory.

Figure 4:
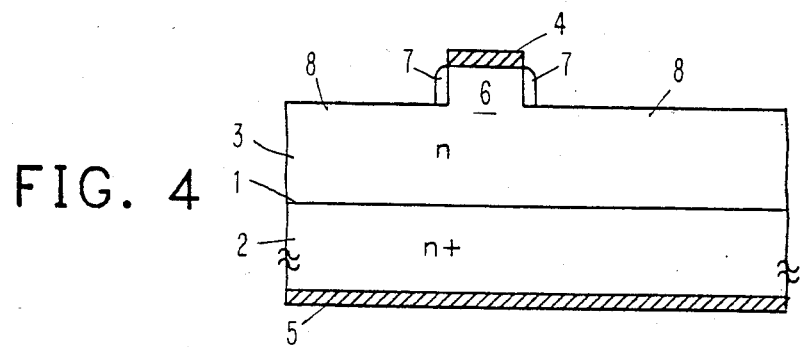

Referring next to FIG. 4, the conformal coating 7 is etched away from all horizontal surfaces leaving remaining the portions of the conformal coating 7 on the sides of the mesa 6 surrounded by the exposed surface 8 of the substrate 1.

Figure 5:
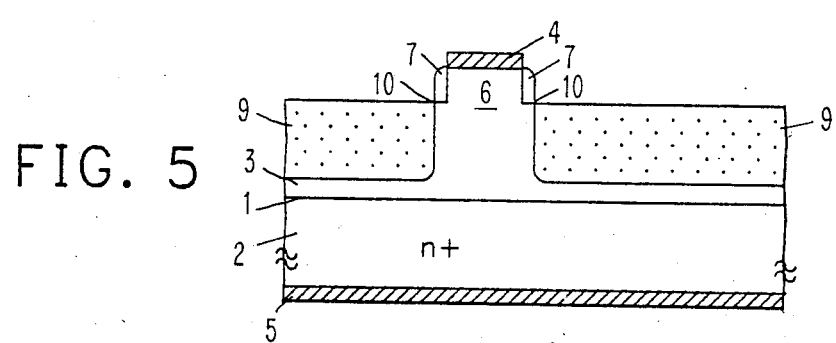

In FIG. 5, a portion of the region 3 surrounding the mesa 6 is altered in characteristics in a vertically oriented step using the combined mesa and the portions of the conformal coating 7 as a mask. The region 3, through the surface 8, is converted to semi-insulating material 9 using such techniques as proton bombardment or oxygen implantation. Since the conversion by bombardment or implantation occurs from the vertical, a shoulder 10 is protected by the lower edge of the remains of the conformal coating 7.

Figure 6:
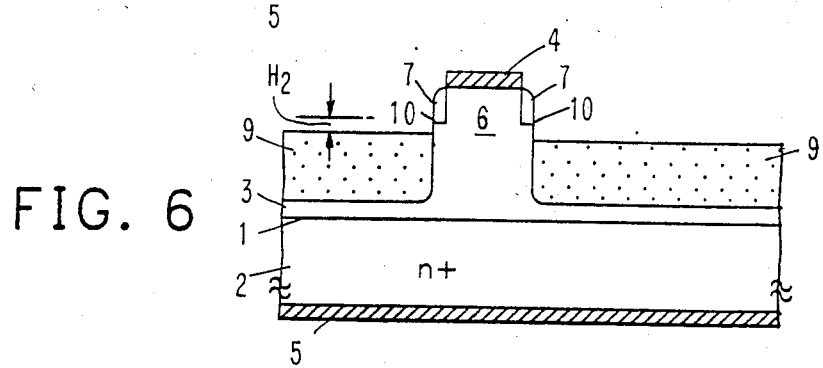

Referring next to FIG. 6, a further vertically oriented eroding operation is performed to expose the shoulder 10 to a selected depth $H_2$. In the fabrication of an FET, an ion milling operation is performed on the surface of the converted region 9 to lower it away from the shoulder 10, a distance $H_2$ which in this case is the thickness of a metal coating that will become the gate of the FET.

Figure 7:
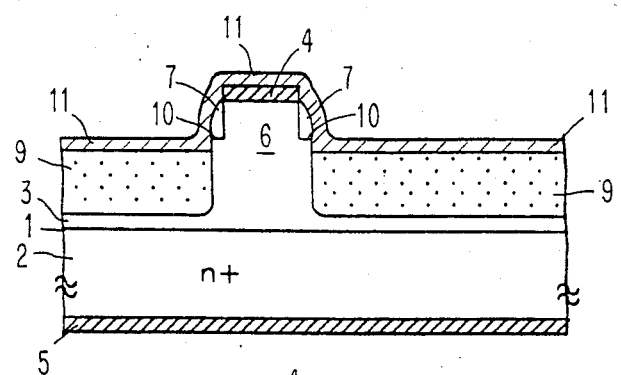

In FIG. 7, the shoulder and the dimension $H_2$ are used to position an electrode in an intermediate location between the ends of the mesa. In this FET the gate is to be formed by a metal 11. The metal 11 is first deposited over the surface of the semi-insulating region 9, the remanents of the conformal coating 7 and on the sides and top of the mesa 6.

Figure 8:
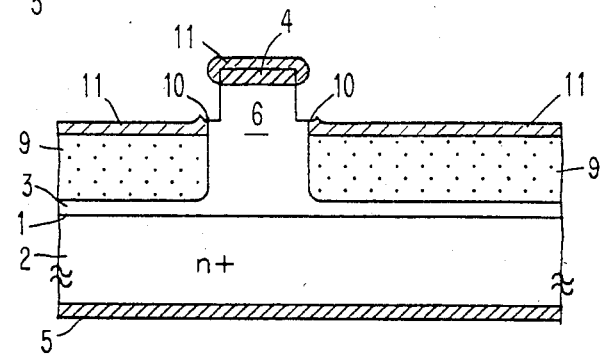

Referring next to FIG. 8, the remaining portions of the conformal coating 7 are now dissolved in the standard "lift-off" approach, which separates the metal 11 at the shoulder 10. The remaining portions of the metal 11 serve as gate electrodes of the FET on each side of the mesa 6 which serves as the channel and as part of the ohmic contact 4. The gate metal thickness at this point is of the order of 0.01 to 0.1 microns.

Figure 9:
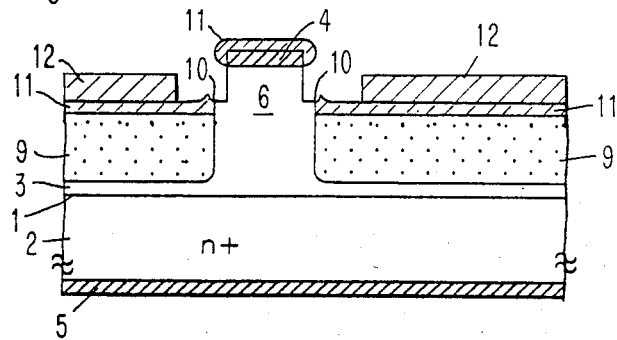

The final structure is shown in FIG. 9 wherein a thicker gate contact metal 12 is applied by standard deposition techniques to the thin gate metal electrodes 11, respectively. The thick metallization 12 operates to reduce gate resistance.

Since the FET device is generally part of a chip, wafer or larger area, a larger contact to the ohmic drain contact 4 can be provided by producing an insulating region by proton bombardment and depositing thereon a metal electrode ohmically connected to contact 4.

What has been described is the use of an edge dimension of a deposited material to define a shoulder for intermediate positioning in the length of a mesa. A vertical field effect structure is illustrated wherein a web channel region has a stepped smaller drain region with the gate contact being made at the step.

Having thus described my invention, what I claim as new and desire to secure by Letters Patent is:

1. A semiconductor structure comprising in combination:
   a monocrystalline semiconductor substrate of one conductivity type having a planar top surface and a mesa extending from said planar top surface;
   wherein said mesa has a step at a given distance from said planar top surface defining a base of said mesa which has a larger cross sectional area than the portion above the step;
   an electrode with a thickness equal to said given distance which forms a rectifying contact with said base of said mesa; wherein said electrode is formed on said planar top surface around the periphery of said mesa contiguous with said base of said mesa; and
   wherein said semiconductor substrate is semi-insulating in that region directly under and contiguous with said electrode;
   ohmic contacts formed on the top of said mesa and the bottom of said substrate.

2. The structure of claim 1 wherein said semiconductor substrate is GaAs.

* * * * *